(12) United States Patent
Toyoda et al.

(10) Patent No.: US 6,629,765 B2
(45) Date of Patent: Oct. 7, 2003

(54) SPREAD ILLUMINATING APPARATUS WITH PRINTED CIRCUIT BOARD HAVING ELASTIC FORCE

(75) Inventors: Koichi Toyoda, Iwata-gun (JP); Takashi Ishii, Iwata-gun (JP)

(73) Assignee: Minebea Co., Ltd., Kitasaku-gun (JP)

( * ) Notice: Subject to any disclaimer, the term of this patent is extended or adjusted under 35 U.S.C. 154(b) by 0 days.

(21) Appl. No.: 10/024,419

(22) Filed: Dec. 21, 2001

(65) Prior Publication Data

US 2002/0080599 A1 Jun. 27, 2002

(30) Foreign Application Priority Data

Dec. 26, 2000 (JP) ............................ 2000-395450

(51) Int. Cl.[7] .............................. G01D 11/28
(52) U.S. Cl. .......................... 362/31; 362/27
(58) Field of Search ............... 362/26, 27, 31; 349/58, 62, 65

(56) References Cited

U.S. PATENT DOCUMENTS

2002/0047953 A1 * 4/2002 Endo ........................... 349/58

* cited by examiner

Primary Examiner—Y. My Quach-Lee
(74) Attorney, Agent, or Firm—Oliff & Berridge, PLC (57) ABSTRACT

There is provided a spread illuminating apparatus to improve the coupling efficiency between members constituting a light source. The light source comprises a bar-like light conductive member and spot-like light sources. The spot-like light sources are mounted and soldered on an FPC, the light conductive member is fitted between the spot-like light sources, and ends of the light conductive member face light emitting surfaces of the spot-like light sources. The FPC has a deformed portion shaped U and forming an open area. An elastic force is generated in the longitudinal direction when the open area is expanded, by inserting the light conductive member whose length is larger than a distance between the spot-like light sources, between the spot-like light sources. This elastic force makes the light emitting surfaces of the spot-like source press on the ends of the light conductive member, and the coupling efficiency therebetween is improved.

4 Claims, 6 Drawing Sheets

SPREAD ILLUMINATING APPARATUS WITH PRINTED CIRCUIT BOARD HAVING ELASTIC FORCE

BACKGROUND OF THE INVENTION

1. Field of the Invention

The present invention relates to a spread illuminating apparatus, and more particularly to a spread illuminating apparatus used as an illuminating means for a liquid crystal display.

2. Description of the Related Art

A liquid crystal display which is low in profile, small in occupied volume and lightweight has been extensively used in electric products including portable telephones and personal computers, and its demand has been increased. However, since a liquid crystal which is a component of the liquid crystal display does not emit light by itself, it is necessary to provide a separate illuminating apparatus besides the liquid crystal display when used in dark places where the solar light or the illumination in a room is not fully available. Thus, this illuminating apparatus which irradiates liquid crystals is desired to be compact and small in power consumption. And, in recent years, a low profile spread illuminating apparatus of side light system (light conductive plate system) is often used as the illuminating means.

FIGS. 5 to 9 show an embodiment of such a spread illuminating apparatus of side light system.

Figure 5:
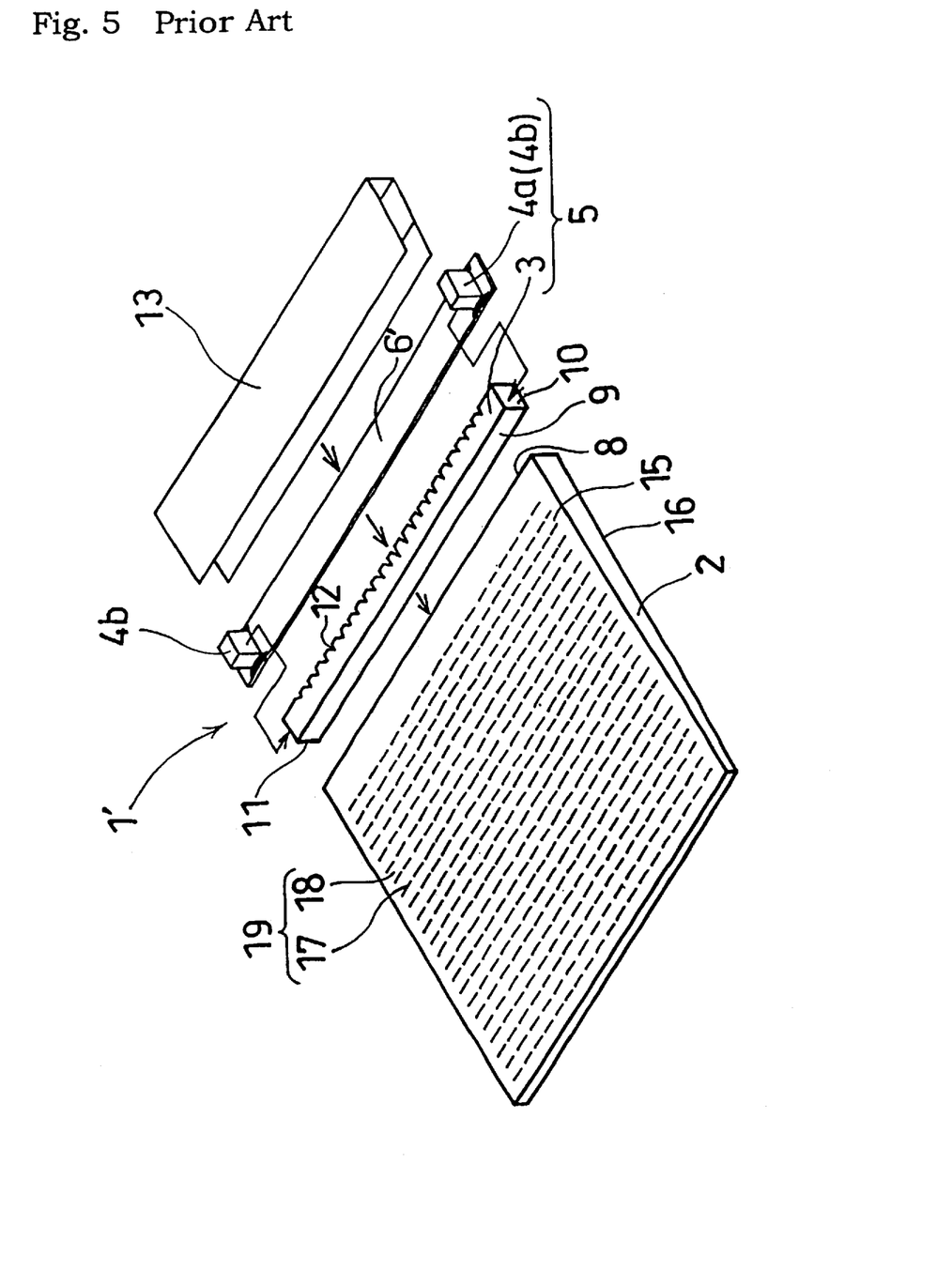
FIG. 5 is an exploded perspective view showing an embodiment of a conventional spread illuminating apparatus.

FIG. 5 is a perspective view showing the spread illuminating apparatus. As shown in the figure, a spread illuminating apparatus 1' generally comprises a transparent substrate (a guide plate) 2 made of a light-transmissible material, and a bar-like light source 5 disposed close to an end surface 8 of the transparent substrate 2. A liquid crystal display (not shown) is disposed under the transparent substrate 2, and this spread illuminating apparatus 1' is used to auxiliarily illuminate the liquid crystal display.

The light source 5 comprises a bar-like light conductive member (guide rod) 3 made of a transparent material and disposed along and close to the end surface 8 of the transparent substrate 2, and spot-like light sources (for example, LED) 4a and 4b disposed facing respectively ends 10 and 11 of the light conductive member 3. The spot-like light sources 4a and 4b are mounted and soldered on a flexible printed circuit board (FPC) 6' formed of an insulating material.

Since an optical path conversion means 12 (comprising grooves substantially triangular in section and flat portions formed therebetween) is provided on a surface of the light conductive member 3 opposing a surface 9 facing the transparent substrate 2, light emitted from the spot-like light sources 4a and 4b is adapted to enter the end surface 8 of the transparent substrate 2 in a substantially uniform manner.

The transparent substrate 2 is formed in a so-called wedge-shape in section in such a manner that the thickness thereof gradually decreases with the increase in distance from the end surface 8. A light reflection pattern 19 comprising grooves 17 and flat portions 18 is formed on an upper surface 15 of the transparent substrate 2, and in this configuration, light coming from the light source 5 and guided into the transparent substrate 2 is reflected in such a manner that an illumination is substantially uniform at the transparent substrate 2 irrespective of the distance from the light conductive member 3.

For allowing light emitted from the spot-like light sources 4a and 4b to efficiently enter the transparent substrate 2, a light reflection member (reflector) 13 is provided around the light conductive member 3. The light reflection member 13 is formed to be substantially square U-shaped, and mounted to longitudinally cover the surfaces of the light conductive member 3 except for the surface 9 facing the transparent substrate 2. The light reflection member 13 is formed of a hard resin having a film vapor-deposited with a metal such as silver, or a white film adhered on its inner surface, or a bent metal sheet of aluminum, stainless steel or the like.

Figure 6:
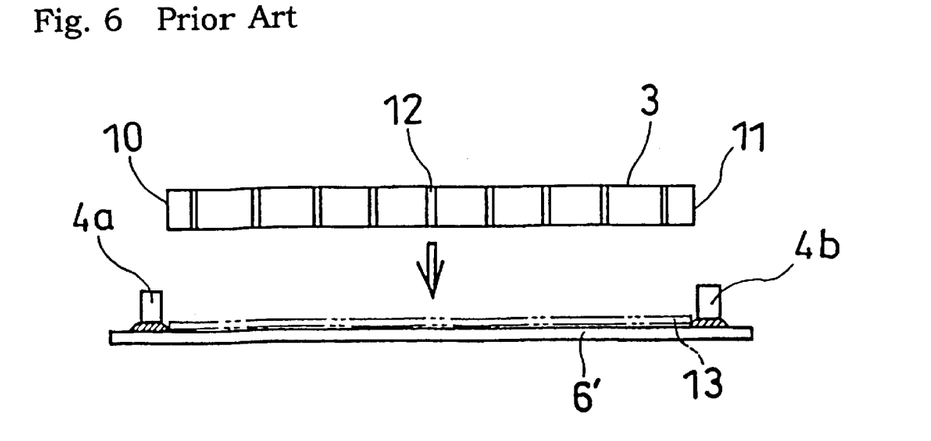
FIG. 6 is a schematic representation showing the light conductive member being fitted between spot-like light sources mounted on the FPC in FIG. 5.
Figure 7:
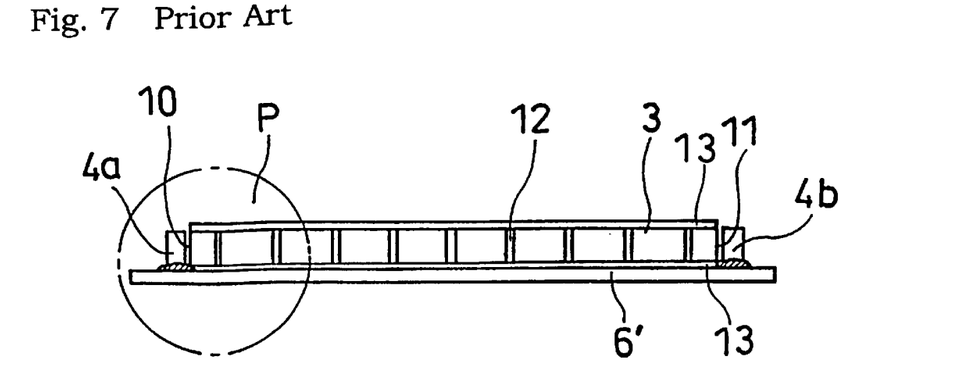
FIG. 7 is a schematic representation showing the positional relationship between the spot-like light sources and the light conductive member in FIG. 6.
Figure 8:
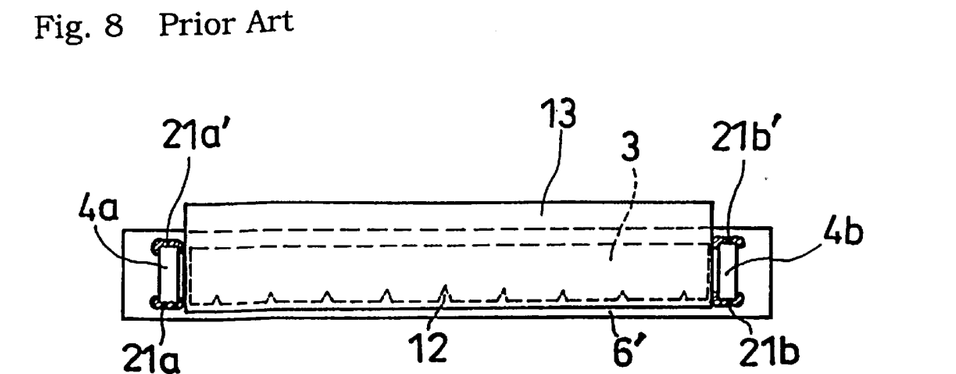
FIG. 8 is a schematic representation showing from a different direction the positional relationship between the spot-like light sources and the light conductive member in FIG. 6.

FIGS. 6 and 7 illustrate the light source 5 showing a surface of the light conductive member 3, on which the optical path conversion means 12 is formed. FIG. 6 shows a view before the light conductive member 3 is fitted between the spot-like light sources 4a and 4b, and FIG. 7 shows a view after the light conductive member 3 is fitted therebetween FIG. 8 shows a top plan view of the light conductive member shown in FIG. 7.

The spot-like light sources 4a and 4b are disposed facing the ends 10 and 11, respectively, of the light conductive member 3, and ends 21a and 21a', and 21b and 21b' of the respective spot-like light sources 4a and 4b are soldered (hereinafter, a part which is soldered is referred to as "soldering part S") on the FPC 6', whereby the spot-like light sources are electrically connected to a signal pattern (not shown) formed on the FPC 6'.

The FPC 6' is substantially rectangular, and disposed under the spot-like light sources 4a and 4b and the light conductive member 3 disposed between the spot-like light sources 4a and 4b.

The light conductive member 3 is disposed so that the ends 10 and 11 face the spot-like light sources 4a and 4b, respectively, namely, disposed so as to be sandwiched between the two spot-like light sources 4a and 4b mounted on the FPC 6'. The surface 9 of the light conductive member 3 is positioned along the end surface 8 of the transparent substrate 2 with a predetermined distance from the end surface 8.

Figure 9:
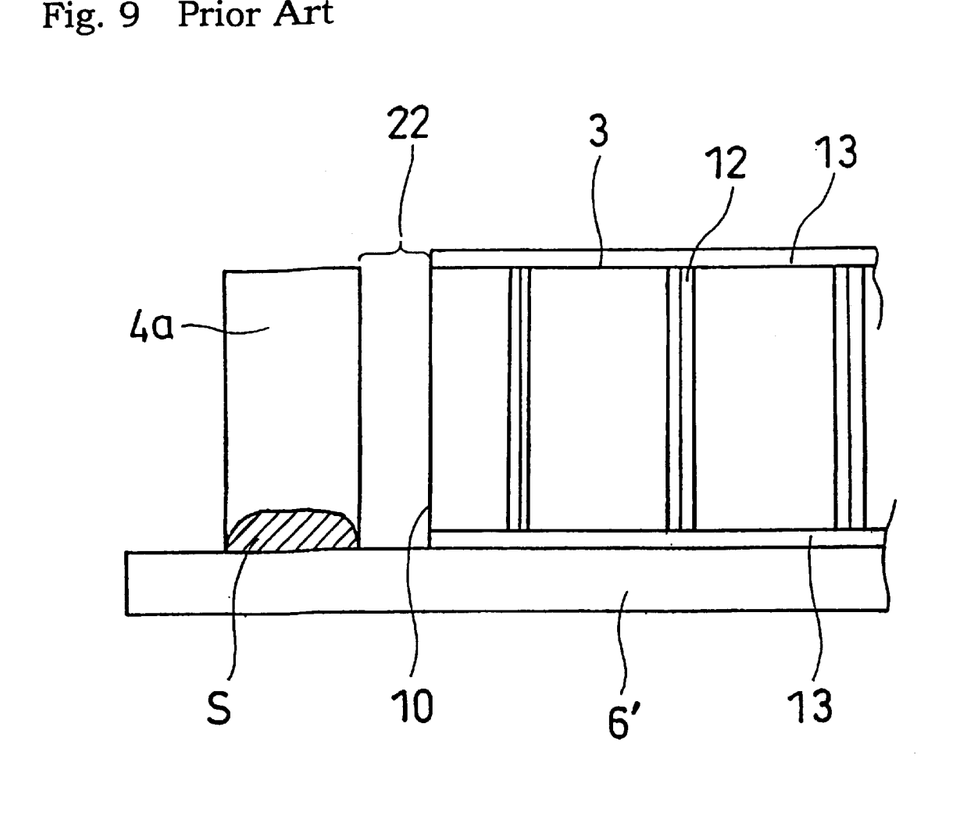
FIG. 9 is a blown-up view showing a part P in FIG. 7.

To obtain excellent optical characteristics in the spread illuminating apparatus, it is required that the light conductive member and the LED's be tightly attached to each other while securely positioned, and that the coupling efficiency therebetween be satisfactory. However, in the conventional art, marginal spaces between the spot-like light sources 4a and 4b and the light conductive member 3 are necessary in order to smoothly fit the light conductive member 3 between the spot-like light sources 4a and 4b mounted on the FPC 6'. The marginal spaces are necessary also for absorbing tolerances of members to be used (the light conductive member, the spot-like light sources, the FPC, etc.). Further, a positional error in mounting the spot-like light sources 4a and 4b on the FPC 6' should be also considered. Thus, as shown in FIG. 9 (a blown-up view of Part P in FIG. 7), a space 22 may exist between the light conductive member 3 and the spot-like light source 4a when the light conductive member 3 is placed between the spot-like light sources 4a and 4b, which degrades a coupling efficiency between both components.

SUMMARY OF THE INVENTION

The present invention has been made in light of the above problem. Accordingly, it is an object of the present invention to provide a spread illuminating apparatus to improve the coupling efficiency between a light conductive member and a spot-like light source.

In order to solve the above problem, according to a first aspect of the present invention, in a spread illuminating apparatus comprising a transparent substrate made of a light-transmissible material, a light source comprising a bar-like light conductive member and spot-like light sources provided at respective ends of the light conductive member, and disposed close to and along an end surface of the transparent substrate, and a flexible printed circuit board (FPC) disposed under the light conductive member, a portion to generate an elastic force in the longitudinal direction of the light source is formed in the FPC which has the spot-like sources mounted thereon and disposed at the respective ends of the light conductive member.

In the present invention, the light conductive member disposed between the spot-like light sources mounted on the FPC is surely fixed by the elastic force generated in the FPC and working in the longitudinal direction of the light source.

According to a second aspect of the present invention, in the spread illuminating apparatus according to the first aspect of the present invention, the portion generating the elastic force is formed such that the FPC has a deformation between the spot-like light sources.

According to a third aspect of the present invention, in the spread illuminating apparatus according to the first or second aspects of the present invention, the deformation of the FPC is U-shaped. Since the FPC is U-shaped, the elastic force in the FPC is given in the longitudinal direction of the light source so as to work toward the spot-like light sources, spaces between the respective spot-like light sources and the light conductive member disposed therebetween can be reduced, and the coupling efficiency between these components is improved.

According to a fourth aspect of the present invention, in the spread illuminating apparatus according to any one of the first to third aspects of the present invention, a wiring pattern of the FPC is designed so that the distance between the spot-like light sources mounted on the FPC is smaller than the length of the light conductive member.

With such a design, an elastic force working in the longitudinal direction of the light conductive member can be generated in the FPC when the light conductive member is fitted between the spot-like light sources, and a positional error in mounting the spot-like light sources on the FPC can be absorbed, whereby the spaces between the respective spot-like light sources and the light conductive member are reduced or eliminated, improving the coupling efficiency between these components.

DESCRIPTION OF THE PREFERRED EMBODIMENTS

Preferred embodiments of the present invention are hereinafter explained referring to the attached drawings. In a spread illuminating apparatus 1 of the present invention, an improvement lies in a FPC having spot-like light sources mounted thereon, so components similar to those of a conventional spread illuminating apparatus 1' can be used therein. The components identical with or corresponding to those in the conventional spread illuminating apparatus are represented by the same reference numerals and detailed description thereof is omitted.

Figure 1:
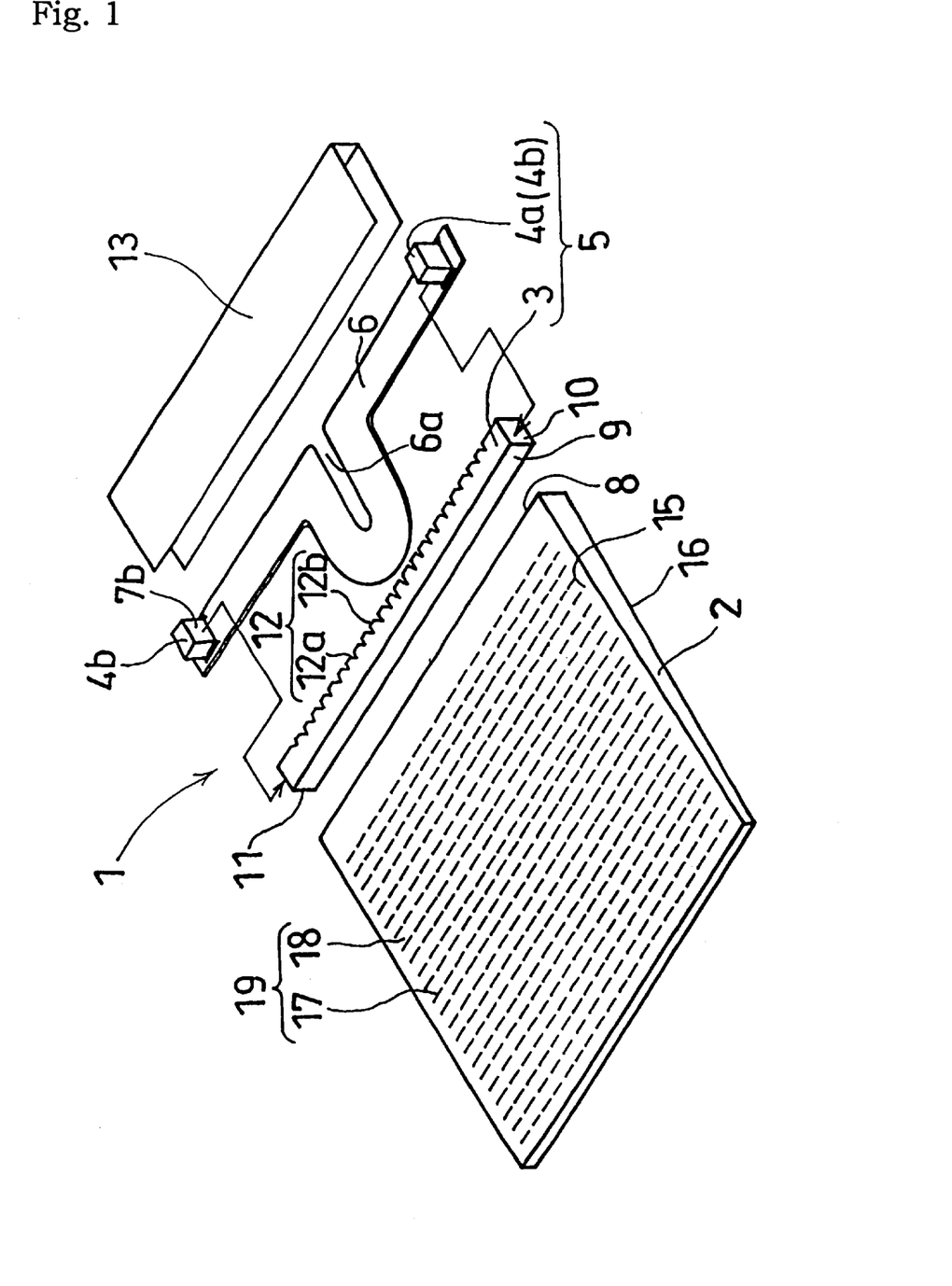
FIG. 1 is an exploded perspective view showing an embodiment of a spread illuminating apparatus in accordance with the present invention.

FIG. 1 is an exploded perspective view showing an embodiment of the spread illuminating apparatus in accordance with the present invention. As shown in the figure, the spread illuminating apparatus 1 generally comprises a transparent substrate (guide plate) 2, a light source 5 disposed along an end surface 8 of the transparent substrate 2, an FPC 6 having spot-like light sources 4a and 4b mounted thereon, and a light reflection member (reflector) 13 to cover the light source 5. The spread illuminating apparatus is used to auxiliarily illuminate a liquid crystal display (not shown) disposed under the transparent substrate 2.

The light source 5 comprises a bar-like light conductive member (guide rod) 3 made of a transparent material, and the spot-like light sources (for example, LED) 4a and 4b disposed facing respectively ends 10 and 11 of the light conductive member 3.

The spot-like light sources 4a and 4b are mounted and soldered on the FPC 6 formed of an insulating material. The light conductive member 3 is fitted between the spot-like light sources 4a and 4b, so that ends 10 and 11 thereof face respectively surfaces 7a and 7b of the respective spot-like light sources 4a and 4b. An open area 6a is formed with the FPC 6 having a deformation, and the FPC 6 gains an elastic force by this open area 6a as described below.

An optical path conversion means 12 is provided on the light conductive member 3 at a surface opposite to a surface 9 facing the end surface 8 of the transparent substrate 2, and comprises, for example, grooves 12a substantially triangular in section and flat portions 12b adjacent thereto. The grooves 12a are formed so that the depth increases gradually in proportion to the increase in distance from the spot-like light sources 4a and 4b and measures maximum substantially at the center of the light conductive member 3. By means of this optical path conversion means 12, light emitted from the surfaces 7a and 7b of the spot-like light sources 4a and 4b enters the end surface 8 of the transparent substrate 2 in a substantially uniform manner irrespective of the distance from the spot-like light sources 4a and 4b. The light conductive member 3 is disposed with its end surface 9 parallel to the end surface 8 of the transparent substrate 2 with a predetermined distance therefrom.

The transparent substrate 2 is formed in a so-called wedge-shape in section, in which the thickness thereof decreases gradually with the increase in distance from the end surface 8. A light reflection pattern 19 comprising grooves 17 and flat portions 18 is formed on an upper surface 15 of the transparent substrate 2 substantially in parallel to the length of the light source 5 (the light conductive member 3). In this configuration, light emitted from the light source 5 and made incident on the transparent substrate 2 is reflected in such a manner that an illumination is substantially uniform everywhere on the transparent substrate 2 irrespective of the distance from the light conductive member 3, and can uniformly irradiate a liquid crystal display (not shown) disposed under the transparent substrate 2.

A light reflection member (reflector) 13 is provided around the light conductive member 3 to efficiently introduce light emitted from the spot-like light sources 4a and 4b into the transparent substrate 2. The light reflection member 13 is substantially square U-shaped, and mounted to cover the longitudinal surfaces of the light conductive member 3 except for the end surface 9 facing the transparent substrate 2 (not including the FPC 6 disposed under the light conductive member 3). Distal end portions of respective opposing plates of the light reflection member 13 are adapted to cover respective end portions of the upper surface 15 and a lower surface 16 of the transparent substrate 2 (thereby holding end portions of the transparent substrates). The coupling force between these components may be increased by applying a double-stick tape or the like to a portion where the light reflection member 13 contacts with the transparent substrate 2. The structure of an inner surface of the light reflection member 13 is the same as explained in the conventional art, and the explanation thereof is thus omitted.

Figure 2:
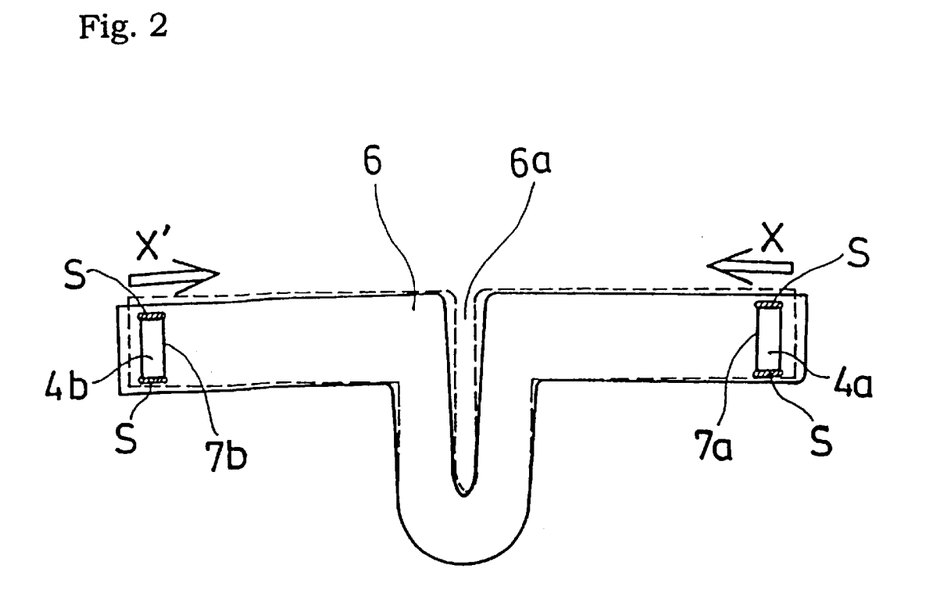
FIG. 2 is a schematic representation showing the transformation of an FPC used in the spread illuminating apparatus in FIG. 1.
Figure 3:
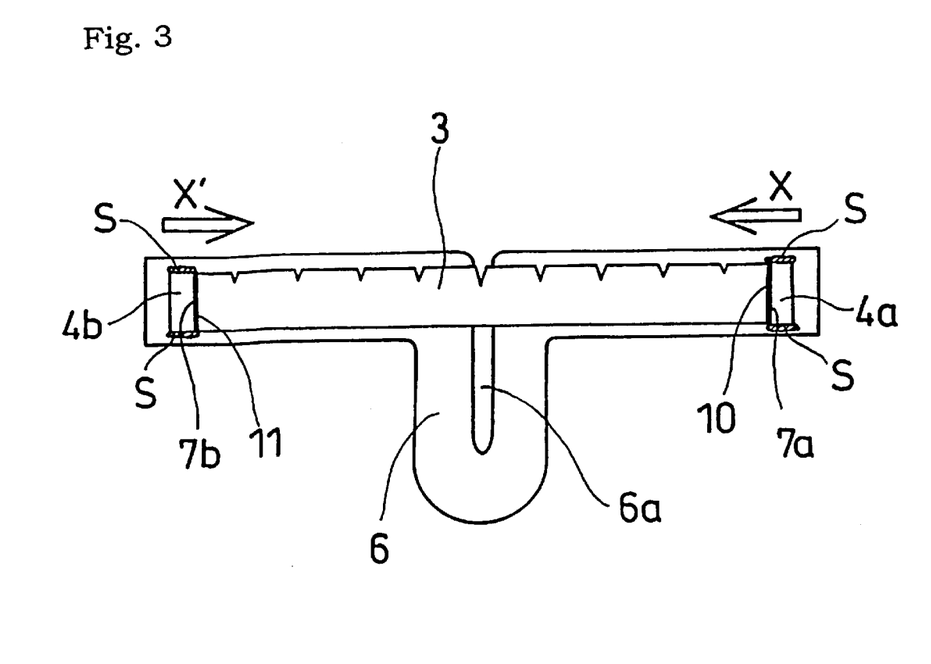
FIG. 3 is a schematic representation showing a light conductive member disposed between spot-like light sources mounted on the FPC.
Figure 4:
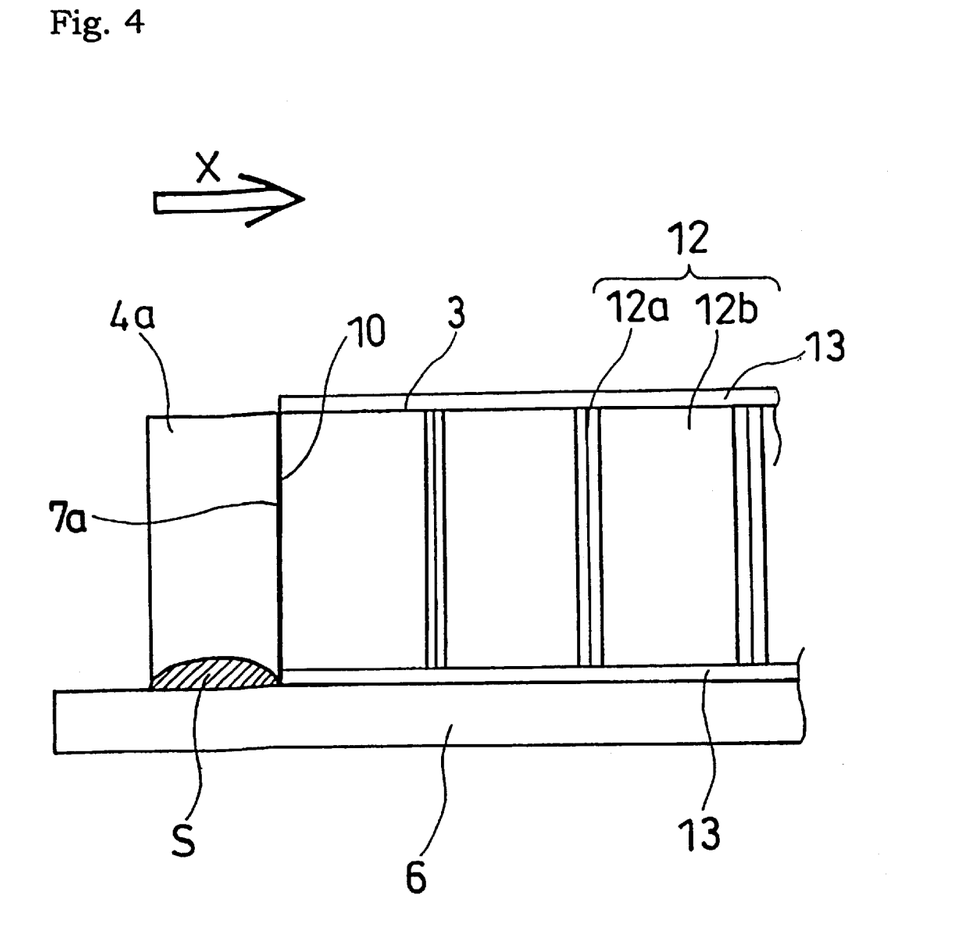
FIG. 4 is a schematic representation showing the positional relationship between the light conductive member and a light source.

An embodiment of the FPC 6 is explained referring to FIGS. 2 to 4.

The FPC 6 is a sheet-like substrate formed of an insulating material, and the spot-like light sources 4a and 4b to constitute the light source 5 of the spread illuminating apparatus 1 are mounted at respective ends of the upper surface of the FPC. The spot-like light sources 4a and 4b each have terminals at both ends thereof, and are electrically connected by soldering to respective copper foil terminals arranged on the FPC 6 (soldering parts S with solder applied thereon). The spot-like light sources 4a and 4b are mounted with their light emitting surfaces 7a and 7b facing each other.

The open area 6a is formed along the FPC 6. The open area 6a is located substantially at the center of the FPC 6 and elongated in the direction parallel to the surfaces 7a and 7b of the spot-like light sources 4a and 4b. The open area 6a is, for example, substantially U-shaped as shown in FIG. 2. The FPC 6 can transform from the normal condition indicated by a broken line to the expanded condition indicated by a solid line in FIG. 2. This means that the FPC 6 is flexible in the direction toward the spot-like light sources 4a and 4b (the direction along the length of the light conductive member 3). When the FPC 6 is in the expanded condition indicated by the solid line, the FPC 6 has an elastic force working in the directions of arrows X and X'.

The deformation of the FPC 6, which forms the open area 6a, is not limited to the above embodiment, and as long as the FPC 6 gains an elastic force working in the directions of the arrows X and X' (so that the spot-like light sources 4a and 4b press the light conductive member toward each other), it may be, for example, V-shaped or W-shaped.

The light conductive member 3 is disposed between the spot-like light sources 4a and 4b mounted on the FPC 6 as shown in FIG. 3. Since the FPC 6 is urged in the direction of the arrows X and X' due to the deformation forming the open area 6a, and thus, the light conductive member 3 is fitted between the spot-like light sources 4a and 4b such that the ends 10 and 11 of the light conductive member touches the surfaces 7a and 7b of the respective spot-like light sources 4a and 4b. The more tightly these components touch each other, the more the efficiency of light incident on the light conductive member 3 improves.

As specific measures to improve the coupling efficiency (to overlap tightly) between the surfaces 7a and 7b of the spot-like light sources 4a and 4b and the ends 10 and 11 of the light conductive member 3, respectively, the distance between the spot-like light sources 4a and 4b mounted on the FPC 6, i.e., the distance between the copper foils arranged on the FPC 6, to which the spot-like light sources 4a and 4b soldered, is designed to be smaller than the length of the light conductive member 3 to be fitted therebetween (or the length of the light conductive member 3 may be designed to be larger than the above mentioned distance). Thus, when the light conductive member 3 is fitted between the spot-like light sources 4a and 4b, the FPC 6 is in an expanded condition, and has an elastic force in the directions of the arrows X and X', and the ends 10 and 11 of the light conductive member 3 are pressed by the surfaces 7a and 7b of the spot-like light sources 4a and 4b thereby reducing or eliminating spaces between both components (refer to FIG. 4).

As described above, by deforming the FPC 6 forming the open area 6a, and further by designing the distance between the spot-like light sources 4a and 4b to be smaller than the length of the light conductive member 3, an elastic force in the longitudinal direction of the light conductive member 3 is given to the FPC 6, whereby the tolerance of members (the light conductive member, the FPC, etc.) to constitute the light source 5 as well as the positional error in mounting the spot-like light sources 4a and 4b can be absorbed, and the coupling efficiency between the surfaces 7a and 7b of the spot-like light sources 4a and 4b and the ends 10 and 11 of the light conductive member 3 is improved.

In the spread illuminating apparatus in accordance with the present invention, an elastic force can be given to the FPC by forming the open area along the FPC. Thus, marginal spaces which are provided between the respective spot-like light sources and the light conductive member in order to easily fit the light conductive member between the spot-like light sources mounted on the FPC, or to absorb the tolerance of the members to constitute the light source, or to absorb the error in mounting the spot-like light sources, need not be taken into consideration, which enables the light emitting surfaces of the spot-like light sources and the ends of the light conductive member to be disposed closer to or in contact with each other, whereby the coupling efficiency between the both components can be improved, light from the spot-like light sources can be made efficiently incident on the light conductive member, and the brightness of the spread illuminating apparatus can be increased.

The present invention is explained with reference to the embodiment having two spot-like light sources, but is not limited to this, and similar effect can be obtained with an embodiment having one spot-like light source on one end of the light conductive member and a reflection plate on the other end.

Further, by deforming a part of the FPC into U-shape, a strong elastic force working in the longitudinal direction of the light conductive member can be given to the FPC, the ends of the light conductive member can be surely pressed by the light emitting surfaces of the spot-like light sources, the coupling efficiency between the both components can be improved, the respective members can be fixed to predetermined positions, and excellent brightness can be realized in an illuminating device.

In addition, by forming the open area at the FPC and also designing the distance between the spot-like light sources mounted on the FPC to be smaller than the length of the light conductive member to be fitted between the spot-like light sources, an elastic force can be surely given to the FPC. Since the FPC has a flexibility in the longitudinal direction of the light conductive member to be fitted between the spot-like light sources, the tolerance of the members to constitute the light source and the positional error in mounting the spot-like light sources can be absorbed. The coupling efficiency between the light emitting surfaces of the spot-like light sources and the ends of the light conductive member can be improved, and excellent brightness can be realized in an illuminating device.

What is claimed is:

1. A spread illuminating apparatus, comprising:

a transparent substrate made of a light-transmissible material;

a light source comprising a bar-like light conductive member and spot-like light sources provided at respective ends of the bar-like light conductive member and disposed along and close to an end surface of the transparent substrate; and a flexible printed circuit board having the spot-like light sources mounted thereon, and disposed under the bar-like light conductive member, wherein an open area is provided on the flexible printed circuit board, whereby an elastic force of the flexible printed circuit board working in a longitudinal direction of the bar-like light conductive member is generated when the bar-like light conductive member whose length is larger than a distance between the spot-like light sources is placed between the spot-like light sources.

2. The spread illuminating apparatus according to claim 1, wherein a part of the flexible printed circuit board is U-shaped.

3. A spread illuminating apparatus, comprising:

a transparent substrate made of a light-transmissible material;

a light source comprising a bar-like light conductive member and spot-like light sources provided at respective ends of the bar-like light conductive member and disposed along and close to an end surface of the transparent substrate; and a flexible printed circuit board having the spot-like light sources mounted thereon, and disposed under the bar-like light conductive member, wherein an open area is provided on the flexible printed circuit board which generates an elastic force by expansion of the open area.

4. The spread illuminating apparatus of claim 3, wherein the expansion of the open area is caused by placing the bar-like light conductive member between the spot-like light sources, wherein a length of the bar-like light conductive member is larger than a distance between the spot-like light sources.

* * * * *